March 24, 1959 J. A. SCHMIDT 2,878,680

TUNING ASSEMBLY

Filed Oct. 28, 1955

INVENTOR.
JOHN A. SCHMIDT
BY Fisher & Swain
ATTORNEYS

United States Patent Office 2,878,680

Patented Mar. 24, 1959

2,878,680

TUNING ASSEMBLY

John A. Schmidt, Cupertino, Calif., assignor to Sierra Electronic Corporation, San Carlos, Calif., a corporation of California Application October 28, 1955, Serial No. 543,467

4 Claims. (Cl. 74—10)

This invention relates generally to a tuning assembly, and more particularly to a tuning assembly of the type used with circuit components of electronic networks.

One type of assembly commonly employed for the operation of variable capacitors or inductances makes use of dial indicating means disposed behind an instrument panel and viewed through a window in the panel wall. The variable capacitor or inductance operated by the assembly is mounted on the main frame or chassis of the equipment that is located behind the panel and which serves to mount additional circuit components such as vacuum tubes and the like. Conventional assemblies of this type are subject to a number of disadvantages. Particularly, any movement of the panel with respect to the chassis will affect the calibration of the capacitor or inductance being tuned. Also, since the panel in this instance forms a part of the housing for the dial indicating means, it is necessary to assemble some of the parts upon the panel.

In general, it is an object of the present invention to provide an improved tuning assembly suitable for variable capacitors and inductances, which is not subject to the disadvantages outlined above.

It is another object of the invention to provide an assembly of the above character which is provided with an individual housing for the dial indicating means, thus obviating the use of a portion of the panel for such purpose.

It is another object of the present invention to provide a tuning assembly which may be calibrated prior to installation on the panel.

It is a further object of the present invention to provide a tuning dial which is simple in construction and which may be assembled prior to being used in the associated electronic equipment.

Figure 2:
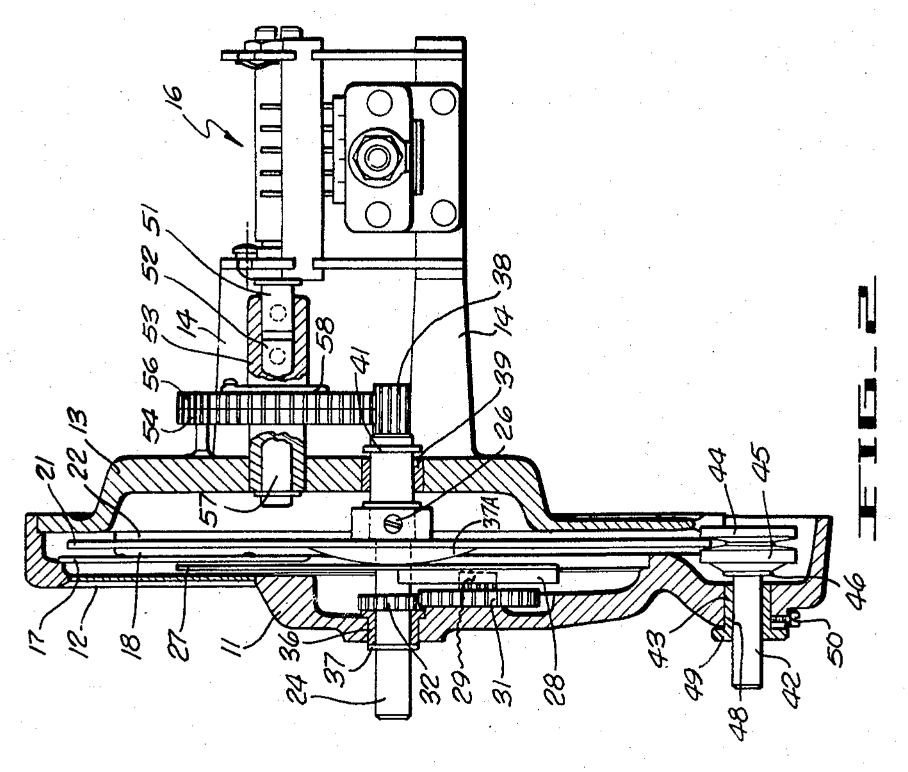
Figure 1:
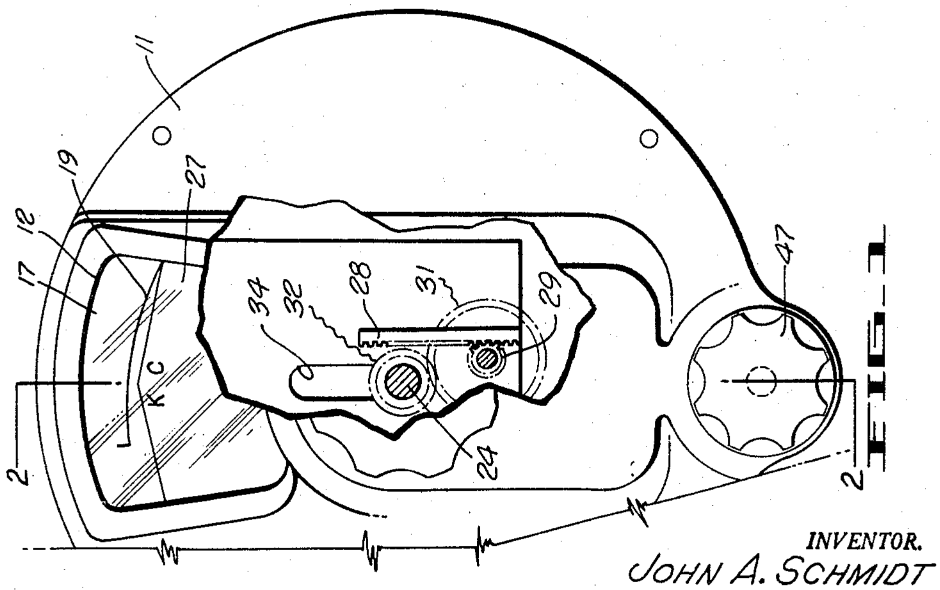

The foregoing and other objects of the invention will be best understood from the following description of one exemplification thereof, reference being made to the accompanying drawings, wherein:

Figure 1 is a fragmentary front elevational view partly broken away and in section of a tuning assembly constructed in accordance with my invention; and Figure 2 is a sectional view taken along the line 2—2 of Figure 1.

Generally, the tuning assembly of my invention comprises a housing which serves to enclose the tuning mechanism and dial and onto which is mounted the variable element.

Referring particularly to Figures 1 and 2, the dial assembly comprises a cowling 11 having an opening 12 formed therein which serves as a window for observing the dial markings. A back plate 13 is adapted to engage the cowling to form a housing for the tuning mechanism. Posts 14 are associated with the back plate 13 and serve to mount the circuit element, for example, the capacitor shown generally by the reference numeral 16. A window

17 is mounted in the opening 12. This window may, for example, be formed of glass or suitable plastic.

A dial 18 having spiral graduations 19 thereon is mounted on the dial plate 21. A reinforcing plate 22 is attached to the back of the dial plate 21. The assembly, composed of the dial 18, plate 21, and back-up plate 22, is journalled by the tuning shaft 24 and is locked thereto by suitable means. For example, a screw 26 may key the dial assembly to the shaft 24 for rotation therewith.

The mask 27 is arranged to track the spiral graduations 19. Tracking is accomplished by mounting the mask on the gear rack 28 which engages the gear 29 and is urged upwardly and downwardly thereby. The gear 31 is mounted adjacent the gear 29 on a common shaft (not shown) journalled to the cowling 11. The gear 32 is adapted to engage the gear 31 and is keyed to the shaft 24 to rotate therewith. Thus, by suitably choosing the gear ratio of the gears 29, 31 and 32, the mask 27 will be urged to track the spiral graduation 19 as the dial is rotated. The opening 34 allows the mask to move with respect to the shaft 24.

The shaft 24 is journalled on the cowling 11 through the bearings 36. The lock ring 37 serves to prevent longitudinal movement of the shaft 24. A spring washer **37*a* is interposed between the dial assembly and the mask and serves to urge the mask and dial assembly away from each other. The far end of the shaft 24 is provided with the gear 38 and is journalled on the back plate 13 by the bearing 39. A locking means 41** prevents longitudinal motion of the shaft.

By turning the knob 24, the dial may be rapidly set to a predetermined position. A fine tuning arrangement is provided for fine adjustment. This arrangement comprises the shaft 42 journalled on the cowling 11 by the bearing 43. A pair of discs 44 and 45 are carried by the shaft 42. The disc 44 is formed as a part of the shaft 42, while the disc 45 is journalled onto the shaft and held in position by the spring washer 46. When the discs 44 and 45 are adjacent one another, a V-shaped annular groove is formed. The periphery of the plate 21 rides within this groove. Fine adjustments may be made by rotating the shaft 42. The bearing 43 has its bore 48 formed off center. Thus, by rotating the hexagonal portion 49, the pressure between the V-shaped groove and the periphery of the plate 21 may be controlled to give the optimum operating conditions. The set screw 50 locks the bearing 43.

The tuning circuit element which may, for example, comprise a capacitor 16 is mounted on the posts 14. The rotating member of the tuning element or capacitor is attached to the shaft 51 which is coupled to the shaft 52 by the member 53. The member 53 is carried by one of the pair of gears 54 and 56. The other of the pair of gears is carried by the shaft 57 which is journalled on the back plate 13. The gears 54 and 56 are spring loaded 58 to prevent backlash as the dial is turned in one direction and the other. As the dial is rotated, the tuning element 16, which is mounted on the back plate, is tuned.

Thus it is seen that I have provided a tuning assembly which is self-contained. The assembly may be assembled in a production line and the tuning assembly calibrated in known manner by rotating the dial 18 relative to the tuning circuit element 16, so that subsequently a predetermined position of the dial relative to the window 12 establishes a predetermined position of the tuning circuit element. After the assembly has been calibrated, it is mounted on the initially mentioned instrument panel, not shown herein. The calibration is not affected by movement of the panel since the assembly, comprising particularly the mutually calibrated dial and tuning circuit element, the inspection window for the dial and the mounting structure for the aforementioned part, forms a composite structure which moves in unison.

I claim:

1. A tuning assembly comprising a dial, a cowling, a back plate adapted to engage said cowling and including mounting posts, a tuning shaft journalled to said back plate and cowling and serving to carry the dial, one end of said shaft extending through said cowling and adapted to mount a tuning knob, and the other end of said shaft extending through the back plate and carrying a gear, a tuning element carried by said mounting posts, said tuning element comprising fixed and movable members, and a shaft engaging said movable members, a pair of gears disposed side by side, backlash preventing means associated with said gears, means serving to carry said gears, and means connecting said gears to the shaft of the movable member, said last named gears engaging said first named gear.

2. Apparatus as in claim 1 in which said cowling and back plate form a housing which houses the dial.

3. Apparatus as in claim 2 in which said dial is spirally calibrated and means are provided for tracking the calibration as the dial is tuned, said means being housed in said housing.

4. A tuning assembly comprising a dial, a cowling, a back plate adapted to engage said cowling and including mounting posts, a tuning shaft journaled to said back plate and cowling and serving to carry the dial, one end of said shaft extending through said cowling and adapted to mount a tuning knob and the other end of said shaft extending through a back plate and carrying a gear, a tuning element carried by said mounting posts, said tuning element comprising fixed and movable members and a shaft engaging said movable members, a pair of gears disposed side by side, backlash preventing means associated with said gears, means serving to carry said gears, means connecting said gears to the shaft of the movable member, said last named gears engaging said first named gear, a bearing having an eccentric bore carried by said cowling, a pair of discs and a shaft serving to carry said discs and journaled in said bearing, said discs being so formed that a peripheral V-shaped groove adapted to engage the periphery of the dial is formed therebetween, whereby rotation of the shaft serves to provide fine adjustment of the dial, and rotation of said bearing serves to adjust the friction between said groove and said dial.

References Cited in the file of this patent

UNITED STATES PATENTS

| | | |
|---|---|---|
| 1,668,418 | Pendleton | May 1, 1928 |
| 1,965,303 | Weber | July 3, 1954 |